(12) United States Patent
Gomm et al.

(10) Patent No.: US 10,355,698 B2
(45) Date of Patent: Jul. 16, 2019

(54) CLOCK CIRCUITS AND APPARATUS CONTAINING SUCH

(71) Applicant: MICRON TECHNOLOGY, INC., Boise, ID (US)

(72) Inventors: Tyler Gomm, Meridian, ID (US); Gary Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 14/258,522

(22) Filed: Apr. 22, 2014

(65) Prior Publication Data

US 2014/0293713 A1  Oct. 2, 2014

Related U.S. Application Data

(60) Continuation of application No. 13/544,152, filed on Jul. 9, 2012, now abandoned, which is a continuation of application No. 12/901,811, filed on Oct. 11, 2010, now Pat. No. 8,217,694, which is a division of application No. 12/345,039, filed on Dec. 29, 2008, now Pat. No. 7,812,657, which is a continuation of
(Continued)

(51) Int. Cl.
*H03L 7/06* (2006.01)
*H03L 7/08* (2006.01)
*H03L 7/081* (2006.01)
*G11C 7/22* (2006.01)

(52) U.S. Cl.
CPC .............. *H03L 7/08* (2013.01); *G11C 7/222* (2013.01); *H03L 7/0812* (2013.01)

(58) Field of Classification Search
CPC .......... G11C 7/222; H03L 7/0816; H03L 7/08; H03L 7/0814; H03L 7/00; H03L 7/0818; H03L 7/0812; H03L 7/06; H03K 5/14; H03K 19/096
See application file for complete search history.

(56) References Cited

U.S. PATENT DOCUMENTS

| 5,604,775 A | 2/1997 | Saitoh et al. |
| 5,663,665 A | 9/1997 | Wang et al. |
| 5,870,445 A | 2/1999 | Farwell |

(Continued)

OTHER PUBLICATIONS

McGraw-Hill Dictionary of Scientific and Technical Terms, 6th edition, published by the McGraw-Hill Companies, Inc., 3 pages, 1997.*

(Continued)

*Primary Examiner* — Hai L Nguyen
(74) *Attorney, Agent, or Firm* — Dicke, Billig & Czaja, PLLC

(57) ABSTRACT

Clock circuits and apparatus containing such are useful in clock synchronization and skew adjustment. Such clock circuits may include a delay line coupled to receive an input signal, wherein the delay line comprises a plurality of delay elements, and wherein at least two delay elements of the plurality of delay elements differ in unit time delay. Such clock circuits may further include a phase detector coupled to receive the input signal and a signal generated from an output signal of the delay line. The phase detector may be configured to compare the input signal to the generated signal and to adjust a length of the delay line to synchronize the input signal and the generated signal.

31 Claims, 10 Drawing Sheets

Related U.S. Application Data application No. 11/132,502, filed on May 19, 2005, now Pat. No. 7,471,130.

(56) References Cited

U.S. PATENT DOCUMENTS

| | | | |
|---|---|---|---|
| 5,920,518 A | 7/1999 | Harrison et al. | |
| 5,926,047 A | 7/1999 | Harrison | |
| 5,946,244 A | 8/1999 | Manning | |
| 5,946,268 A | 8/1999 | Iwamoto et al. | |
| 5,946,712 A | 8/1999 | Lu et al. | |
| 6,005,430 A | 12/1999 | Brown et al. | |
| 6,011,732 A | 1/2000 | Harrison et al. | |
| 6,028,461 A | 2/2000 | Kobayashi | |
| 6,049,241 A | 4/2000 | Brown et al. | |
| 6,069,506 A | 5/2000 | Miller, Jr. et al. | |
| 6,137,325 A | 10/2000 | Miller, Jr. | |
| 6,137,334 A | 10/2000 | Miller, Jr. et al. | |
| 6,150,856 A | 11/2000 | Morzano | |
| 6,173,432 B1 | 1/2001 | Harrison | |
| 6,204,710 B1 | 3/2001 | Goetting et al. | |
| 6,289,068 B1 | 9/2001 | Hassoun et al. | |
| 6,292,040 B1 * | 9/2001 | Iwamoto | H03K 23/544 327/149 |
| 6,304,116 B1 | 10/2001 | Yoon et al. | |
| 6,359,482 B1 | 3/2002 | Miller, Jr. et al. | |
| 6,377,092 B2 * | 4/2002 | Ikeda | H03K 5/133 327/158 |
| 6,385,129 B1 | 5/2002 | Silvestri | |
| 6,388,480 B1 | 5/2002 | Stubbs et al. | |
| 6,396,322 B1 | 5/2002 | Kim et al. | |
| 6,438,060 B1 | 8/2002 | Li et al. | |
| 6,445,231 B1 | 9/2002 | Baker et al. | |
| 6,448,756 B1 | 9/2002 | Loughmiller | |
| 6,452,431 B1 | 9/2002 | Waldrop | |
| 6,535,038 B2 | 3/2003 | Hofstra | |
| 6,556,489 B2 | 4/2003 | Gomm et al. | |
| 6,570,419 B2 | 5/2003 | Hanzawa et al. | |
| 6,570,813 B2 * | 5/2003 | Van De Graaff | G11C 7/1066 365/189.05 |
| 6,586,979 B2 | 7/2003 | Gomm et al. | |
| 6,605,969 B2 | 8/2003 | Mikhalev et al. | |
| 6,636,093 B1 | 10/2003 | Stubbs et al. | |
| 6,661,717 B1 | 12/2003 | Gomm et al. | |
| 6,664,830 B2 | 12/2003 | Miller | |
| 6,680,874 B1 | 1/2004 | Harrison | |
| 6,693,472 B2 | 2/2004 | Mikhalev et al. | |
| 6,704,881 B1 | 3/2004 | Li et al. | |
| 6,727,734 B2 | 4/2004 | Gomm | |
| 6,728,163 B2 | 4/2004 | Gomm et al. | |
| 6,737,897 B2 | 5/2004 | Gomm et al. | |
| 6,774,687 B2 | 8/2004 | Gomm et al. | |
| 6,798,259 B2 | 9/2004 | Lin | |
| 6,801,070 B2 | 10/2004 | Gomm et al. | |
| 6,803,826 B2 | 10/2004 | Gomm et al. | |
| 6,812,760 B1 | 11/2004 | Kim et al. | |
| 6,836,166 B2 | 12/2004 | Lin et al. | |
| 6,839,301 B2 | 1/2005 | Lin et al. | |
| 6,839,860 B2 | 1/2005 | Lin | |
| 6,842,399 B2 | 1/2005 | Harrison | |
| 6,867,627 B1 | 3/2005 | Murtagh | |
| 6,895,522 B2 | 5/2005 | Johnson et al. | |
| 6,906,566 B2 | 6/2005 | Drexler | |
| 6,917,228 B2 | 7/2005 | Cooper | |
| 6,950,487 B2 | 9/2005 | Lin et al. | |
| 6,998,897 B2 * | 2/2006 | Pilo | H03K 5/133 327/276 |
| 7,049,873 B2 | 5/2006 | Pilo et al. | |
| 7,072,433 B2 | 7/2006 | Bell | |
| 7,099,425 B2 | 8/2006 | Thiele | |
| 7,471,130 B2 | 12/2008 | Gomm et al. | |
| 7,812,657 B2 | 10/2010 | Gomm et al. | |
| 8,217,694 B2 | 7/2012 | Gomm et al. | |
| 2002/0157031 A1 | 10/2002 | Lin | |
| 2002/0172314 A1 | 11/2002 | Lin et al. | |
| 2002/0190766 A1 | 12/2002 | Waldrop | |
| 2003/0012320 A1 | 1/2003 | Bell | |
| 2003/0215040 A1 | 11/2003 | Bell et al. | |
| 2003/0227308 A1 | 12/2003 | Cooper | |
| 2005/0007157 A1 | 1/2005 | Harrison | |
| 2005/0024108 A1 | 2/2005 | Lin | |
| 2005/0041486 A1 | 2/2005 | Cooper | |
| 2005/0052210 A1 | 3/2005 | Johnson | |
| 2005/0062510 A1 | 3/2005 | Zarate et al. | |
| 2005/0083092 A1 | 4/2005 | Silvestri | |
| 2005/0110539 A1 | 5/2005 | Lee | |

OTHER PUBLICATIONS

Kwak, et al., "A Low Cost High Performance Register-Controlled Digital DLL for 1Gbps x32 DDR SDRAM," 2003 Symposium on VLSI Circuits Digest of Technical Papers, 2 Pgs.

Yoo, et al., "A 1.8-V 700-Mb/s/pin 512-Mb DDR-II SDRAM With on-Die Termination and off-Chip Driver Calibration," IEEE Journal of Solid-State Circuits, vol. 39, No. 6, Jun. 2004, 11 Pgs.

Matano, et al., "A 1-Gb/s/pin 512-Mb DDRII SDRAM Using a Digital DLL and a Slew-Rate-Controlled Output Buffer," IEEE Journal of Solid-State Circuits, vol. 38, No. 5, May 2003, 7 Pgs.

Dehng, et al., "A Fast-Lock Mixed-Mode DLL Using a 2-b SAR Algorithm," IEEE Journal of Solid-State Circuits, vol. 36, No. 10, Oct. 2001, 8 Pgs.

Kuge, et al., "A 0.18-um 256-Mb DDR-SDRAM with Low-Cost Post-Mold Tuning Method for DLL Replica," IEEE Journal of Solid-State Circuits, vol. 35, No. 11, Nov. 2000, 10 Pgs.

Lin, et al., "A Register-Controlled Symmetrical DLL for Double-Data-Rate DRAM," IEEE Journal of Solid-State Circuits, vol. 34, No. 4, Apr. 1999, 4 Pgs.

* cited by examiner

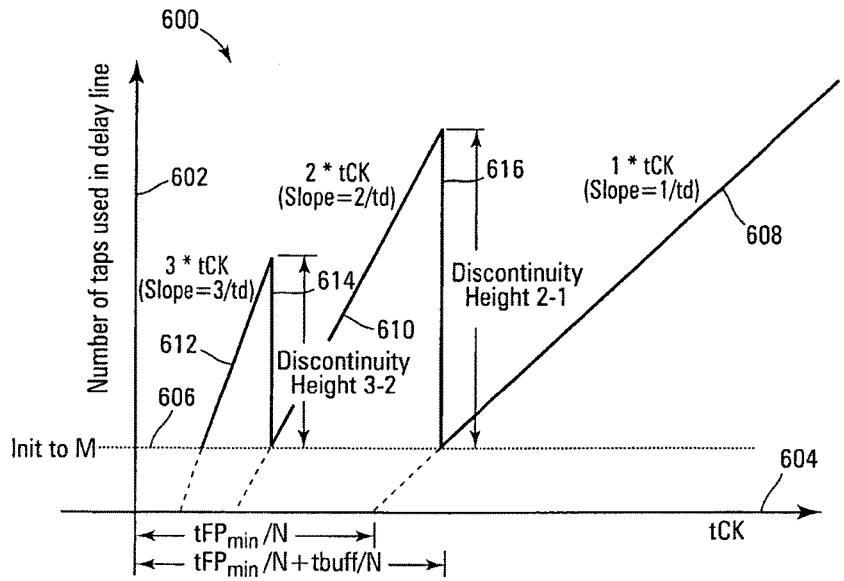

N = Integer number of clocks in DLL loop
td = Coarse delay per stage
tID = Minimum DLL delay (Intrinsic Delay)
$tFP_{min}$ = IO delay + clock tree + tID (this is the minimum forward-path delay)
M = Interger number of delay line buffer delays
T = Total delay stages (including buffer)
tbuff = M*td
$N_{min}$ = Lower value of N at a given discontinuity

*Variable* Delay Line Delay = $N \cdot tCK - tFP_{min}$  Slope of lines = $\frac{N}{td}$
(including delay line buffer)

Total Delays Required = $\frac{N \cdot tCK_{max} - tFP_{min}}{td}$  Y intercept of ALL lines = $-\frac{tFP_{min}}{td}$
(including delay line buffer)

Discontinuity Location = $\frac{tFP_{min} + tbuff}{N_{min}}$  (note: y intercept is NOT influenced by tbuff)
(position on x-axis)

Discontinuity Height = $\frac{tFP_{min} + tbuff}{td \cdot N_{min}}$  $tCK_{max}$ = $\frac{T \cdot td + tFP_{min}}{N}$
(on loop delay N)

Delay Line Buffer = $\frac{tbuff}{N_{min}}$  $tCK_{min}$ = $\frac{tFP_{min}}{N}$
(on loop delay N)

FIG. 6

CLOCK CIRCUITS AND APPARATUS CONTAINING SUCH

RELATED APPLICATIONS

This application is a continuation of U.S. patent application Ser. No. 13/544,152 filed Jul. 9, 2012 (now abandoned), and titled "DUTY CYCLE CORRECTOR CIRCUITS, which is a continuation of U.S. patent application Ser. No. 12/901,811, (now U.S. Pat. No. 8,217,694), filed Oct. 11, 2010, and titled "METHODS AND APPARATUS FOR SYNCHRONIZING WITH A CLOCK SIGNAL," which is a divisional of U.S. patent application Ser. No. 12/345,039 (now U.S. Pat. No. 7,812,657), filed Dec. 29, 2008 and titled "METHODS AND APPARATUS FOR SYNCHRONIZING WITH A CLOCK SIGNAL," which is a continuation of U.S. patent application Ser. No. 11/132,502 (now U.S. Pat. No. 7,471,130), filed May 19, 2005 and titled "GRADUATED DELAY LINE FOR INCREASED CLOCK SKEW CORRECTION CIRCUIT OPERATING RANGE," which are commonly assigned and incorporated by reference in their entirety herein.

TECHNICAL FIELD

The invention relates to integrated circuits, and more particularly, to clock synchronization and skew adjustment circuits.

BACKGROUND

In modern integrated circuits and computer systems, increasing clock speed and high speed signal transitions are resulting in an increased need for accurate signal timings, communications, and system clock synchronization to allow for proper operation. For example, memory access speed and the resulting data transfer bandwidth has been a typical bottleneck in computer systems and other digital applications. A newer type of dynamic random access memory (DRAM), known as a synchronous DRAM or SDRAM, has been developed to provide faster operation and improve memory access times. SDRAMs are designed to operate synchronously with the system clock with input and output data synchronized to an active edge of the system clock which is driving the processor accessing the SDRAM.

Although SDRAMs have overcome some of the timing disadvantages of other memory devices memory, access is still a limiting factor, and there is a need for still faster memory devices. With this in mind, double data rate (DDR) SDRAMs were developed to allow data transfers on both the rising and falling edges of the system data clock, providing twice the operating speed of the conventional SDRAM. Thus, DDR SDRAM provides up to twice as much data bandwidth as the conventional SDRAM for a given data clock. In addition, as with SDRAM, DDR SDRAMs are also capable of providing bursts of data at a high-speed data rate. It is noted that other synchronous memory types, including, but not limited to quad data rate (QDR), synchronous graphic DRAM (SGDRAM), DDR II SDRAM, and Rambus memory standards. It is further noted that other memory types, memory busses and memory interfaces, including, but not limited to, video RAM (VRAM), static RAM (SRAM), read only memory (ROM), electrically erasable programmable ROM (EEPROM), and Flash memory with both synchronous and asynchronous interfaces, are also well known in the art.

As system and integrated circuit clock frequencies increase, it is desirable to have less uncertainty in signal timings. For example, one such critical timing in modern computer systems is when valid data is available on the output of memory devices. In modern integrated circuits, clock synchronization and skew adjustment circuits (also known as clock recovery and/or duty cycle correction circuits) are commonly utilized to reduce this signal timing uncertainty by synchronizing with clock signals and/or other periodic signals and adjusting the signal delay and/or conditioning the signal itself. Such clock synchronization and skew adjustment circuits include, but are not limited to the digital delay locked loop (DLL), the synchronous mirror delay (SMD), and the duty cycle corrector (DCC). These circuits typically utilize large delay lines of multiple sequentially coupled delay elements to achieve their goal of synchronizing with and/or adjusting the duty cycle of an input periodic signal, such as a system clock. Because of this, the circuits can consume a large area of the integrated circuit die and consume significant amounts of power while in operation. In addition, as clock frequencies increase and signal timings become increasingly critical, the need for finer resolution in these clock synchronization and skew adjustment circuits is increasing. This in turn typically requires an increase in the number of the delay elements and a decrease in their individual time delay to achieve the required granularity in the delay lines utilized by these circuits. This is particularly an issue in integrated circuits that must operate over a wide range of clock frequencies in that the granularity of the delay lines and delay elements must be sized for the required resolution of the highest clock frequencies and yet be long enough to operated with/contain the slowest signals of the specified range of frequencies within the delay line.

For the reasons stated above, and for other reasons stated below which will become apparent to those skilled in the art upon reading and understanding the present specification, there is a need in the art for a system to reduce clock synchronization and skew adjustment circuit size in integrated circuits and memory devices while maintaining adequate resolution.

BRIEF DESCRIPTION OF THE DRAWINGS

FIGS. 6, 7A, 7B, 8A and 8B detail lock curves of feedback based clock synchronization circuit/DLL circuits in accordance with embodiments of the present invention.

DETAILED DESCRIPTION

Figure 1:
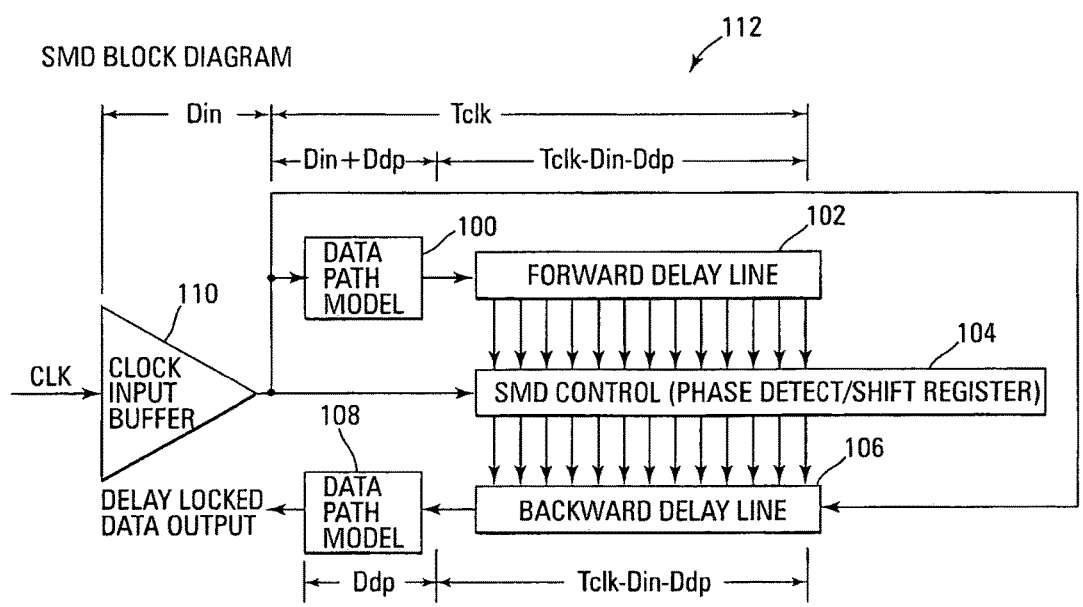
FIG. 1 details a SMD circuit in accordance with embodiments of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Clock synchronization and skew adjustment circuits of embodiments of the present invention utilize differing unit time delay elements in the delay lines in either a graduated or a stepped unit time delay arrangement, allowing a reduced circuit implementation and improved clock frequency lock characteristics. The stepped or graduated delay lines allow for reduced circuit size while maintaining a high resolution by placing a fine delay element granularity at the most critical timings for accurate signal lock. Integrated circuits and memory devices utilizing clock synchronization and skew adjustment circuits in accordance with embodiments of the present invention utilize time delays with either a graduated or a stepped time delay arrangement in their delay lines. These graduated or a stepped unit time delays allow reduction of the number of fine unit delay elements of the delay lines to only those necessary to sense and adjust for the high frequency signals or that portion of the clock signal time period that is critical for operation of the integrated circuit or memory device. The described invention allows clock synchronization and skew adjustment circuits to be implemented in an optimized manner that exhibits a reduced overall circuit size and power consumption, while improving lock characteristics over a wide range of frequencies.

As stated above, in modern integrated circuits, commonly utilized clock synchronization and skew adjustment circuits include, but are not limited to the digital delay locked loop (DLL), the synchronous mirror delay (SMD), and the duty cycle corrector (DCC).

DLL circuits generally consist of a delay line of individual delay elements, a shift register, phase comparator, and an associated control circuit. The DLL generates a delayed clock signal via a delay line, typically controlled with a shift register. The delay line consists of serially connected delay elements. The output from the delay line is then compared with the DLL feedback signal, and this variable delay is iteratively adjusted in the shift register by the control circuit of the DLL until a match or "lock" with the input clock signal is achieved. When the circuit containing the DLL is powering up or coming out of a low power mode it is not uncommon for 50 or more clock cycles to pass until the feedback based DLL attains a lock with the external clock, delaying operation of the integrated circuit or initial access to a memory device. In many cases the output clock signal is also adjusted for the fixed delays of the integrated circuit input clock signal path and the output path (also known as the data path) of the generated clock signal.

In contrast, a SMD circuit also generates a replica of an input clock signal, but is not considered an iterative or feedback based design. Because of this design approach, SMD circuits can attain a lock with the external clock signal in as few as two clock cycles. This ability greatly decreases the time to first access when an integrated circuit, such as a DDR SDRAM, first powers up or comes out of a low power mode. A SMD circuit generally includes a data path model delay (replicating the input buffer and output path delays), two delay lines and an accompanying control circuit. The delay lines and control circuit must be of a length sufficient to accommodate the full time period of the longest clock pulse to be matched. Because of this, an SMD circuit generally requires more layout space to implement on the integrated circuit than a DLL. In operation, an input clock signal pulse transitions through the data path model and enters the first delay line to transition through the unit delay elements. The following input clock pulse triggers the control circuit to load the contents of the first delay line into the second delay line. The loaded clock signal then becomes the basis of the internally generated clock signal as it is transitioned back out of the second delay line.

A related circuit to the DLL and SMD clock synchronization circuits is the duty cycle corrector (DCC), which is utilizes two or more delay lines to adjust or restore the proper timing and pulse width to an input signal. A DCC circuit generally includes a phase detector, and two or more sequentially coupled delay lines, where the total length of the delay lines must be of a length sufficient to accommodate the full time period of the longest clock pulse to be corrected. In operation, the DCC typically utilizes only one rising or falling edge of the clock signal and generates the other at the appropriate placement to adjust or restore the proper duty cycle of the input signal. The input clock signal pulse enters the first delay line to transition through the unit delay elements. Upon exiting the end of the first delay line the signal enters the second delay line. The output of the second (final) delay line, which should be approximately one clock signal (360°) off the incoming input signal, is then compared against the following input clock pulse by the phase detector. The phase detector then adjusts taps on the delay lines until a match occurs and the clock is "locked in." Since the same control signals are fed from the phase detector to both of the delay lines, they remain in a fixed ratio to each other that is dependent on individual lengths of the delay lines. The fixed ratio of the first delay line to the second delay line means that their outputs can be utilized to restore the original duty cycle of a signal or to adjust the duty cycle to whatever ratio is desired. It is also noted that additional delay lines can be added in series within the sequence of the first and second delay lines to generate other signals, such as clock signals that are phase shifted at selected ratios from the input or higher frequency signals (N*tck) that are generated from and synchronized with the input clock signal (tck).

As stated above, in the clock synchronization and skew adjustment circuits of embodiments of the present invention, a mixture of lower time period fine delay elements and larger time period coarse delay elements are utilized that are stepped or graduated in their individual time delays to reduce the total number of delay elements used in the delay line. In this approach the fine delay elements are utilized to cover the high frequency and/or critical timing regions of the range of input clock signals, while the coarse delay elements are utilized in less timing critical or regions of the delay lines utilized by slower frequency clock signals. This allows for a high resolution and fine adjustment capability to be used in critical timing areas and coarser resolution in frequency ranges to be used where we are operating at slower frequency or out of specification and are thus by definition less critical. This also allows for a wider range of clock cycle times to be covered by a given clock synchronization and skew adjustment circuit with fewer frequency range crossover issues. In addition, the use of a stepped or graduated delay line of fine and coarse delay elements allows for a reduction in the total number of delay elements used, reducing the overall circuit size, layout complexity and power usage. Reducing the total number of delay elements may also reduce the size of the control circuitry of the clock synchronization and skew adjustment circuit, further reducing the overall circuit size, layout complexity and power usage.

The specification for jitter and noise in most clock synchronization and skew adjustment circuits is specified in the time to data access ($t_{ac}$) for the integrated circuit or memory device it is contained in. Because of the reduced number of delay elements, reduced control circuitry, reduced number of driven signal lines and reduced power usage, clock synchronization and skew adjustment circuits of embodiments of the present invention also reduce the amount of generated voltage noise and lock jitter. In addition, the improved resolution at critical timings or frequencies allow embodiments to exhibit an increased accuracy frequency lock at these timings, while the reduced number of total delay elements reduce the time to initial lock by reducing the total number of possible lock iterations.

Delay elements typically contain active devices, such as NAND gates, inverters, other logic gates or amplifiers. Delay element designs include, but are not limited to, a NAND gate coupled to an inverter, two series coupled NAND gates, two series coupled inverters. Additional delay element structures or gate delays, such as, skew limited delays and RC delays, will be apparent to those skilled in the art with the benefit of the present specification. The time delay of individual delay elements can also typically be increased by increasing the size of the channel widths of the transistors they are composed of, or, in the case of the RC delay, by increasing the capacitance or resistance of the delay element.

Prior art delay lines typically contain 100 or more of these delay elements. As most common delay elements contain one or more active devices any signal noise that is inserted in the delay line will typically get amplified as it progresses through the delay line. Because of these active devices in the delay elements, the error due to the amplified noise will tend to get worse the deeper it progresses through the delay line, increasing lock jitter and synchronization error. Thus, in addition to reducing the overall power usage and generated voltage noise, by reducing the number of active elements the error is amplified through clock synchronization and skew adjustment circuit embodiments of the present invention that utilize reduced length stepped or graduated delay lines also reduce their susceptibility to lock jitter and synchronization error.

In designing the graduated delay lines of clock synchronization and skew adjustment circuits of embodiments of the present invention, both the integrated circuit application and operational characteristics of the particular clock synchronization and skew adjustment circuit being used should be considered. In general, there are two main architecture types that are utilized in modern clock synchronization and skew adjustment circuits to be considered in designing delay line embodiments of the present invention; feedback based circuits that can contain multiple clocks in the feedback loop (wrap-around) and feedback and non-feedback based circuits that will not contain multiple clocks within their delay lines during operation.

In non-feedback and non-wrapping feedback based clock synchronization and skew adjustment circuit embodiments of the present invention (circuits that do not internally wrap-around the clock signal and go to multiple clock signals within the delay lines at higher frequencies when they run out of delay elements in their delay lines), such as SMD and DCC circuits, the graduating or stepping to coarser/lower resolution delay elements can begin as soon as the necessary fine resolution is achieved at the critical timings or frequency ranges. This stepping or graduating is typically done according to a resolution de-rating table or curve specified by the designer so as to achieve acceptable resolution at the specified operating frequency ranges of the integrated circuit it is utilized in. It is noted that in many cases, once an integrated circuit or memory device is being operated outside of the frequency range of its design specification the signal timings are out of specification anyways and therefore the accuracy of the frequency lock is, by definition, less critical. It is also noted that clock synchronization and skew adjustment circuit embodiments of the present invention can be designed so that they contain multiple regions of critical timing or frequency ranges and thus the stepping or graduation of delay elements in the delay lines of these embodiments may contain multiple regions of increased fine or coarse delay elements at the critical or non-critical regions of the delay line. It is further noted that these regions of increased fine or coarse delay elements can be progressively stepped or graduated up or down into.

In clock synchronization and skew adjustment circuit embodiments of the present invention that internally wrap-around the clock signal, such as DLL circuits, graduating or stepping to coarser/lower resolution delay elements must take into consideration the "lock curve" of the clock synchronization and skew adjustment circuit. The lock curve is a sawtooth shaped graph of the number of delay elements that will be utilized to lock at a given frequency. In this lock curve, the number of delay elements reduces to the minimum possible each time the clock signal is wrapped around internally (so that an additional clock cycle is held within the delay lines) to lock to a higher frequency clock signal range. In these circuits, the stepping or graduation of the delay line to coarser delay elements is preferably designed so that the stepping or graduation does not affect higher frequency sections of the lock curve by stepping or graduating too early and inadvertently affecting the higher frequency/higher integer clock cycle saw-tooth sections of the lock curve.

FIG. 1 details a SMD circuit 112 of an embodiment of the present invention. The SMD circuit 112 of FIG. 1 includes a clock input buffer 110, a data path model (DPM) 100, forward delay line (FDL) 102, a SMD control circuit 104, a backward delay line (BDL) 106, and the real data path (RDP) element 108. The RDP 108 symbolically represents the real data path circuitry delay added by internal circuitry of the system, such as clock drivers and other logic delays that the SMD circuit of FIG. 1 is implemented into and is not a real circuit component. The FDL 102 and BDL 106 are comprised of delay elements (not shown) that have a stepped or graduated unit delay. The input buffer 110 and real data path 108 add additional internal delays for the SMD circuit, $d_{in}$ for the input buffer 110 and delay of $d_{dp}$ for the RDP 108, that are compensated for by the DPM 100.

The SMD circuit 112 receives an external clock signal through the input buffer 110, which couples the received clock signal to the SMD control 104 and the DPM 100. The received clock signal is passed through the DPM circuit 100, which has a delay of $d_{in}+d_{dp}$, replicating the delays of input buffer 110 and real data path 108 in order to account for them in the recovery of the clock signal. The clock signal is then passed to the forward delay line (FDL) 102, where it is passed sequentially from delay element to delay element. The combined delay of the DPM 100 and the FDL 102, is such that the forward edge of the received clock signal is still within the FDL 102 when the next external clock signal is received at the input buffer 110. Upon receiving the next external clock signal the input buffer 110 again couples it to the SMD control 104 and the DPM 100 circuits. The next external clock signal enters the DPM circuit 100 and the FDL 102 chain to become the basis of the next recovered clock signal. The next external clock signal also triggers the SMD control 104, which transfers the current clock signal from the position it has attained in the FDL 102 delay chain to the same position in the BDL 106 delay chain. The next external clock signal enables the BDL 106 and the initial clock signal then flows backwards through the BDL 106, which is the same length as the FDL 102 and composed of the same stepped or graduated unit delay elements. Because the BDL 106 is the same length as the FDL 102 the clock signal will take the same amount of time to transition through it and will therefore exactly replicate the input clock signal. The additional delay factors of the input buffer 110 and clock driver 108 will already be taken into account in the clock signal loaded into the BDL 106 by the pre-delay of the DPM 100, that effectively subtracts the delay factors from the time period measured by the FDL 102. The recovered and skew adjusted clock signal is coupled from the BDL 106 to provide a synchronous clock for the circuit that the SMD circuit of FIG. 1 is implemented into, the delay of which is represented by the real data path 108.

Figure 2:
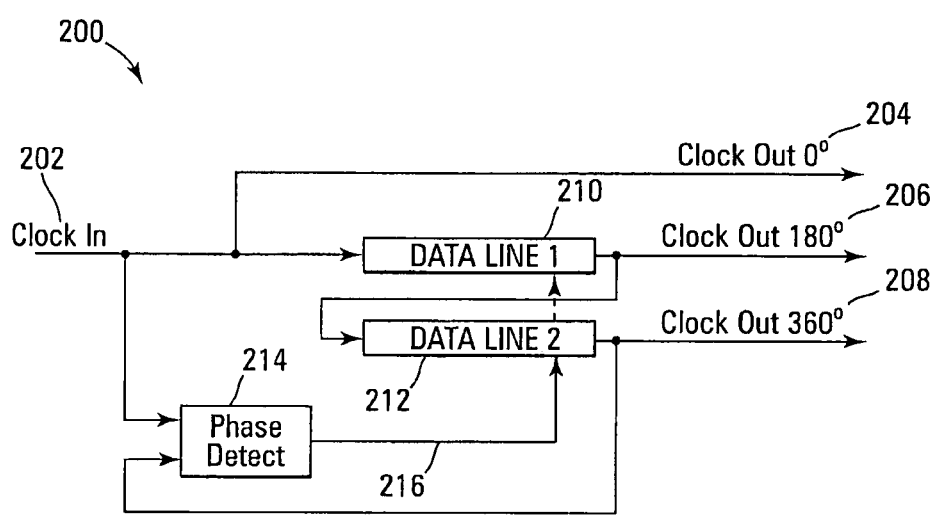
FIG. 2 details a DCC circuit in accordance with embodiments of the present invention.

FIG. 2 details a DCC circuit 200 of an embodiment of the present invention that has been designed to adjust an input clock signal back to a 50% duty cycle. The DCC circuit 200 contains two sequentially coupled delay lines 210, 212 and a phase detector 214. Because the DCC circuit 200 of FIG. 2 corrects the input clock signal back to a 50% duty cycle, it contains two sequentially coupled delay lines 210, 212 which are equal in length. In operation, a clock signal enters the DCC on the clock input 202 and coupled to the phase detector 214, the first delay line 210, and a 0° clock output 204. The clock signal propagates through the first delay line 210 and, upon its output, is coupled to the input of the second delay line 212 and an intermediate 180° clock output 206. The clock signal then propagates through the second delay line 212 and is coupled upon output to the phase detector 214 and a 360° clock output 208. The phase detector 214 then compares the 360° clock output from the second delay line 212 to the next incoming clock signal (the 0° clock) received at the clock input 202 and iteratively adjusts the lengths of both the first and second delay lines equally, selecting differing output taps, until the 0° clock and the 360° clock match and the DCC circuit 200 "locks" to the clock signal and the DCC has been adjusted so that an entire period of the input clock signal fits within the delay lengths of the sequentially coupled first and second delay lines 210, 212.

Since the first and second delay lines 210, 212 are adjusted an equal amount by the control signals 216 from the phase detector 214, they remain in a fixed ratio to each other that is dependent on the relative lengths of the delay lines 210, 212 to each other. And since these lengths are equal, the outputs 204 and 206 are 180° out of phase with each other and can be logically combined to set an output clock signal with a 50% duty cycle that is synchronized to the rising or falling edge of the input clock signal. It is noted that other DCC circuit 200 embodiments of the present invention, with differing numbers of delay lines and duty cycle or phase shifted output signals are possible and should be apparent to those skilled in the art with the benefit of the present disclosure.

Figure 3:
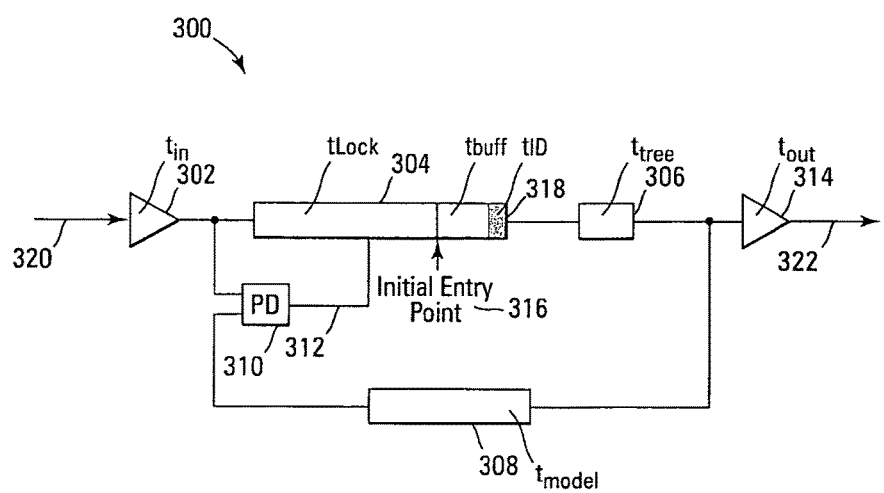
FIG. 3 details a DLL circuit in accordance with embodiments of the present invention.

FIG. 3 details a DLL circuit 300 of an embodiment of the present invention. The DLL circuit 300 of FIG. 3 contains an input buffer 302, a delay line 304, a clock tree delay element 306, an output buffer 314, an input model delay element 308 and a phase detector 310. The input buffer 302 is coupled to the input of the delay line 304 and an input of the phase detector 310. The delay line output is coupled to the clock tree delay 306. The output of the clock tree delay 306 is coupled to the clock output buffer 314 and the input model delay 308. The output of the input model delay 308 is coupled to another input of the phase detector 310. The output of the phase detector 310 is coupled 312 to the delay line 304 controlling its adjustment.

Figure 4:
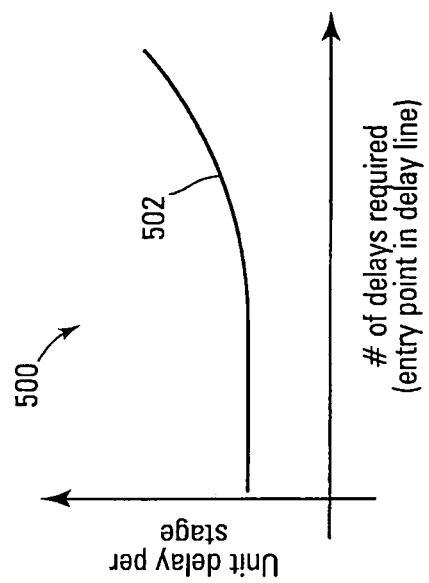
FIGS. 4 and 5 detail stepped and graduated delay curves in accordance with embodiments of the present invention.

In operation the delay line 300 of the DLL circuit 300 is utilized to generate a replica of an input clock signal 320. The incoming input clock signal 320 is coupled to the input buffer 302 and triggers the start of the propagation of the generated clock signal in the delay line 304. The generated clock signal output from the delay line is then adjusted for known delay of the internal clock distribution tree (the propagation path of the generated clock signal within the integrated circuit) by being propagated through the tree delay 306. The generated clock signal is then coupled to the output buffer 314 to become the synchronized output clock signal 322. The clock signal output from the tree delay 306 is also coupled through the input buffer model 308 (which models and compensates for the delay effect of the input buffer 302 and output delay 314) to the phase detector 310. The phase detector 310 compares the delay adjusted generated clock signal to the following input clock signal and adjusts 312 the length of the delay line (typically by a fixed amount, such as +/− a single delay element on each clock cycle, although adaptive adjustment is also known) to bring the generated clock signal closer to matching the input clock signal frequency. This adjustment of the delay line 304 is iteratively repeated until a match or "lock" of the input clock signal 320 is achieved by the DLL circuit 300. When the circuit containing the DLL circuit 300 is powering up or coming out of a low power mode it is not uncommon for 50 or more clock cycles to pass until the feedback based DLL circuit 300 attains a lock with the external clock, delaying initial operation of or access to the integrated circuit or memory device. Upon power-up or initialization of the DLL circuit 300 typically starts clock generation and iteration at its initial entry point 316 to begin searching for a lock to the input clock signal 320. This initial entry point 316 is typically chosen close to the highest frequency lock of the DLL circuit 300. Lock to the most likely/highest frequency input clock signal is typically achieved in the tLock region of the delay line 304, with the tbuff region designed to accommodate variations due to voltage and temperature differences. The tID region 318 represents the intrinsic delay, the smallest delay/number of delay elements that the delay line 304 is capable of. It is typically because of this tID region 318 and the tree delay, which set a fixed minimum delay/delay elements of the DLL circuit 300 that discontinuities of the DLL circuit's lock curve occur when wrap-around occurs and multiple clock signals are present within the DLL circuit's loop. It is noted that other DLL circuit 300 embodiments of the present invention are possible and should be apparent to those skilled in the art with the benefit of the present disclosure. As stated above, both stepped and graduated delay lines can be graduated up and down and/or have multiple "peaks" and "valleys" in the delay line unit delay profile to provide appropriate coverage for the specific implementation. It is noted, however, that the most common format will include a delay line profile that only increases in unit delay time, such as shown in FIGS. 4 and 5.

As stated above, clock synchronization and skew adjustment circuits of embodiments of the present invention incorporate stepped or graduated delay lines. FIGS. 4 and 5 detail simplified diagrams of a stepped delay line 400 and a graduated delay line 500 of embodiments of the present invention. The graphs of FIGS. 4 and 5 detail delay line delay element profiles, where the number of delays in the delay line increases as one traverses the x-axis and the unit time delay of each delay element is shown on the y-axis of the graph. FIG. 4 details a stepped delay line profile 400 that "steps" 402 with an abrupt transition to a higher unit time delay for each additional delay element in the delay line. It is noted, as stated above, that stepped delay lines are particularly useful in retrofitting existing designs by simply increasing the unit delay of the existing delay elements of the design, typically by increasing the size of delay element transistors. It is also noted that stepped delay line profiles 400 can include one or more "steps" 402 in the unit time delay of each delay element in the delay line profile.

Figure 5:
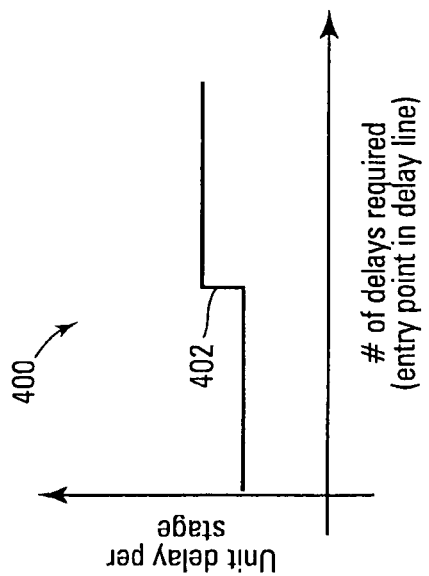

Graduated delay lines 500, such as detailed in FIG. 5, differ from stepped delay lines 400 in that they gradually increase 502 in unit time delay per delay element, such that each following delay element utilized in the delay line has a higher unit time delay than the proceeding delay element. Unlike a stepped delay line, the smoother graduated delay line will produce the maximum unit delay only when needed and will tend to minimize clock synchronization and skew adjustment circuit performance and design issues due to the lack of abrupt transitions in the delay line. It is noted that as the number of steps of the stepped delay line profile 400 are increased in number, the stepped delay line profile becomes more and more that of a graduated delay line profile 500. It is also noted that the aspects of stepped and graduated delay lines can be combined, such that the "step" of a stepped delay line is gradually transitioned through in a graduated manner to allow the delay line to avoid possible instabilities due to an abrupt transition. It is further noted that other delay line profiles 400, 500 of embodiments of the present invention are possible and should be apparent to those skilled in the art with the benefit of the present disclosure.

As also stated above, stepped or graduated delay lines in non-feedback based and non-wrapping feedback based clock synchronization and skew adjustment circuits of embodiments of the present invention, such as SMD circuits or DCC circuits, can begin graduating or stepping to coarser/lower resolution delay elements as soon as the necessary fine resolution is achieved at the critical timings or frequency ranges. This stepping or graduating is typically done according to a resolution de-rating table or curve specified by the designer so as to achieve acceptable resolution at the specified operating frequency ranges of the integrated circuit it is utilized in. It is noted that in many cases, once an integrated circuit or memory device is being operated outside of the frequency range of its design specification the signal timings are out of specification anyways and therefore the accuracy of the frequency lock is, by definition, less critical.

FIG. 6 details a lock point curve for a feedback based clock synchronization and skew adjustment circuit, such as a DLL circuit, of an embodiment of the present invention that can "wrap-around" internally and contain one to N clock cycles internal to the forward path of the circuit. The clock multiples may not necessarily be contained within the DLL delay line, but in the I/O delay (and I/O model delay). This wrap-around capability allows the circuit the advantage of being able to synchronize with a large range of clock frequencies. However, it leads to the above detailed characteristic "sawtooth" lock point curve as the differing amounts of delay lines are required to lock as additional clock periods are wrapped around and added to the internal loop as the input clock frequencies change. In addition, many of these circuits have a minimum amount of delay that is possible in the feedback loop, further adding to the discontinuities when the circuit wraps around.

Because of this "wrap-around" ability of a feedback based clock synchronization and skew adjustment circuit, such as a DLL circuit, a stepped or graduated delay line should begin its graduation or stepping to coarser delay elements for lower frequencies above the delay element peak of (the highest number of delay elements used by) the previous higher frequency lock curve sawtooth, as stated above. This will allow the stepping or graduation to not affect higher frequency sections of the lock curve where more fine resolution is desirable by stepping or graduating too early and inadvertently affecting these higher frequency/higher integer clock cycle saw-tooth sections of the lock curve.

In FIG. 6, a lock curve of feedback based clock synchronization and skew adjustment circuit, such as a DLL circuit, is shown having a y-axis 602 of the number of delay elements inserted in the delay line to lock (the number of delay element signal taps used) and the duration of the corresponding clock period on the x-axis 604. A series of sawtooth peaks (3*tCK, 2*tCK, and 1*tCK) are detailed each having an N*tCK lock slope 612, 610, and 608 on the left side and a discontinuity 614, 616 on the right where clock wrap-around occurs. The minimum amount of delay in the delay line/minimum number of delay elements is shown by the horizontal line "Init to M" 606. Each of the sawtooth peaks (3*tCK, 2*tCK, and 1*tCK) is due to the N number of clock cycles (N*tCK) being held within the DLL circuit loop (the feedback based clock synchronization and skew adjustment circuit) for the circuit to synchronize and lock-in at a given input clock frequency range. It is noted that the number of clock cycles held in the DLL loop increase as the input clock frequency is increased and that the slope (N/td) of each sawtooth lock curve 612, 610, 608 increases in steepness as the clock frequency is increased. It is also noted that the top of each higher frequency sawtooth peak ({N+1}*tCK) is lower than the previous peak (N*tCK). Thus, if graduated or stepped delay lines of embodiments of the present invention are designed to begin graduating or stepping to longer coarser delay elements at delay elements that are above the peak of the next higher frequency sawtooth curve ({N+1}*tCK) in the delay line they will not inadvertently affect the lock ability and resolution at these higher clock speeds.

Figure 7A:
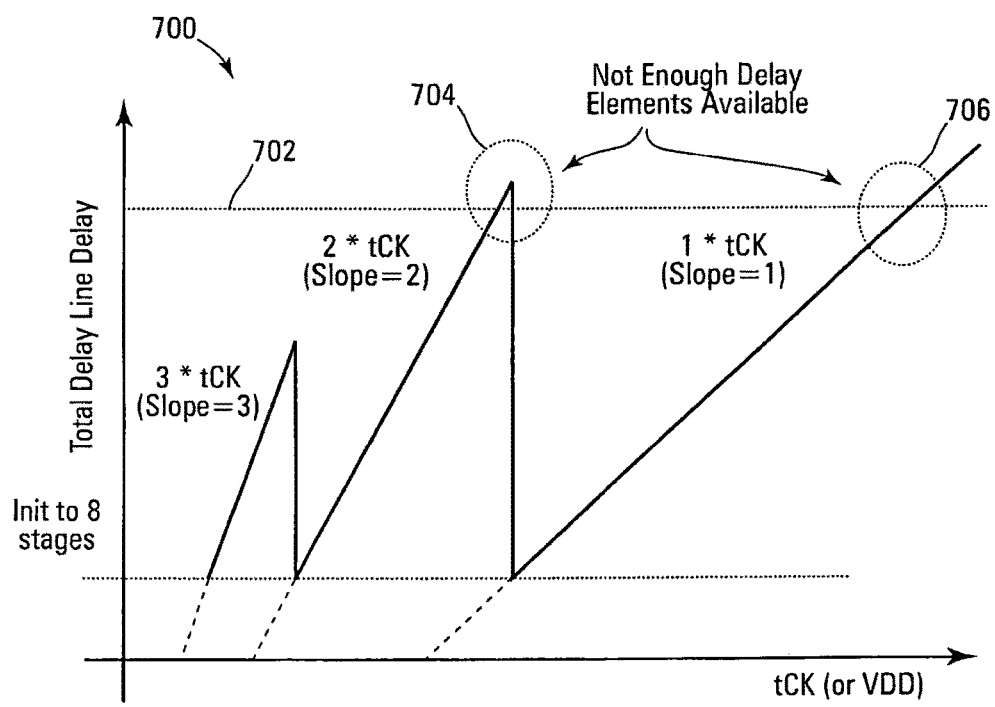
Figure 7B:
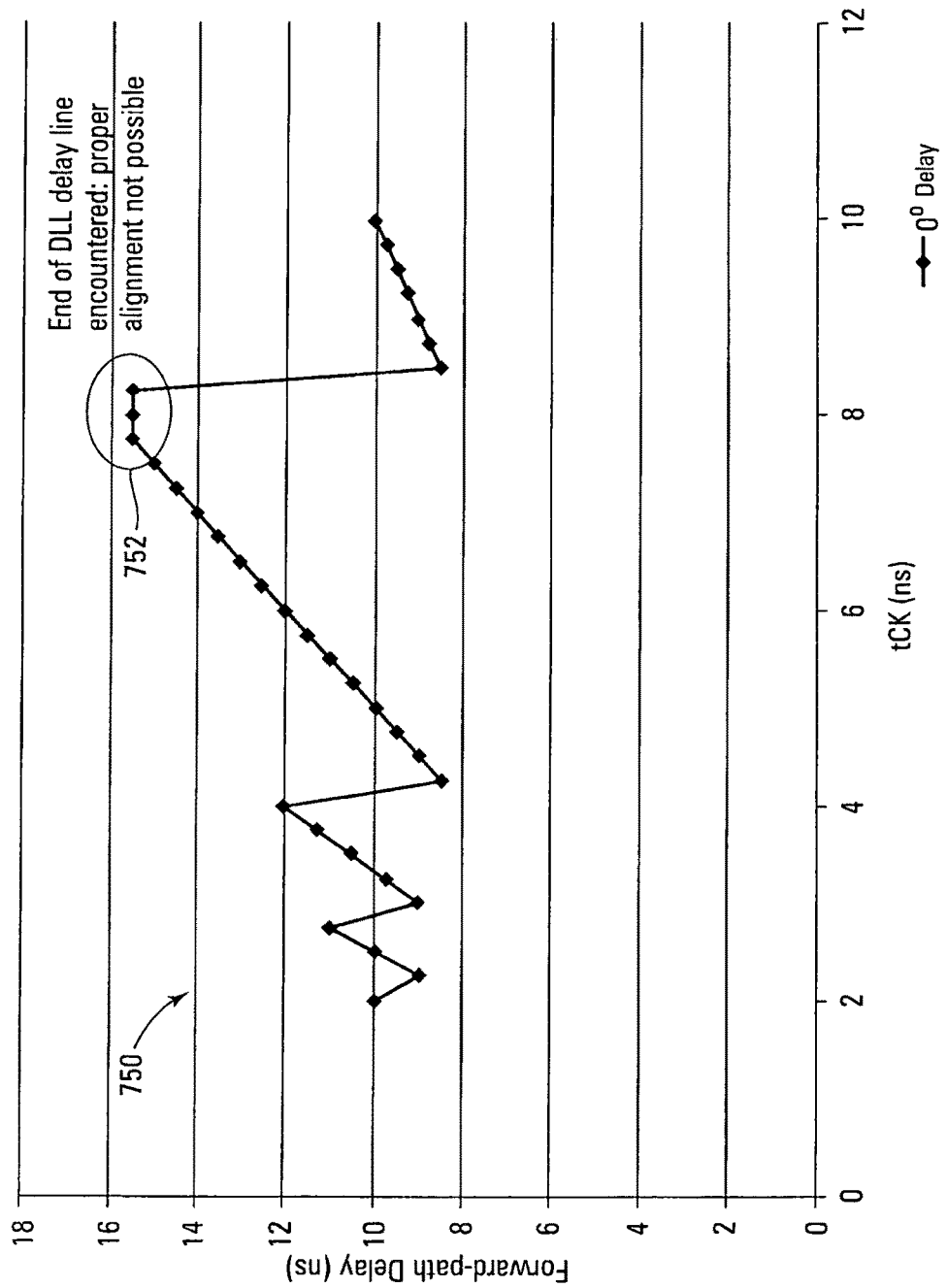

FIGS. 7A and 7B show lock curves 700, 750 of feedback based clock synchronization and skew adjustment circuit, such as a DLL circuit, where the circuit does not have enough delay elements to lock at slower frequencies. In FIG. 7A, the limit of the number of total delay elements is shown by horizontal line 702. The upper limits of both the 2*tCK lock curve sawtooth 704 and 1*tCK lock curve sawtooth 706 are shown extending beyond this limit 702 in the total delay/total number of delay elements available in the delay line of the circuit. Because of this, the feedback based clock synchronization and skew adjustment circuit will fail to appropriately lock at the frequencies where the lock curve extends beyond the limit 702 in the number of available delay elements in the delay lines, as shown in regions 704 and 706. An example of such a failure is shown in FIG. 7B, where the lock curve 750 of a feedback based clock synchronization and skew adjustment circuit implemented with too little time delay and/or delay elements is shown. It is noted that a peak 752 of the lock curve 750 has been flattened by the lack of available delay elements, as the DLL hangs on the end of the sawtooth curve before transitioning to the next lower curve. It is noted that in some cases, where the DLL has not been designed to hang on the end of the closest matching lock curve 752, it will reset and start searching for a new lock point. In these cases the part loses lock entirely (instead of being simply out of specification) and will not work at all at these frequencies.

Figure 8A:
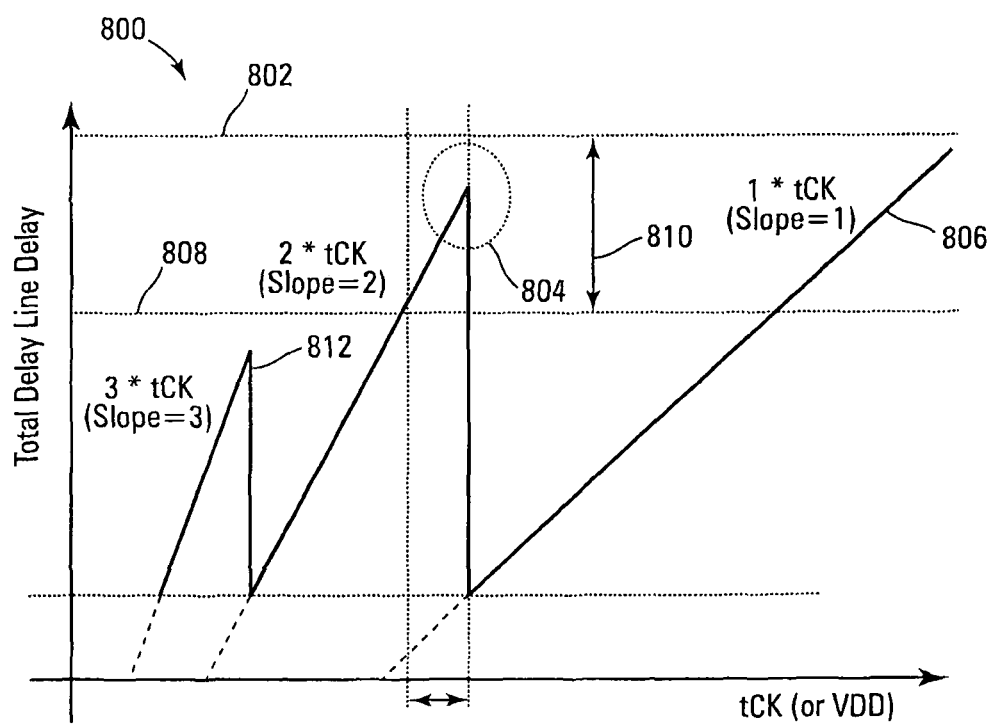
Figure 8B:
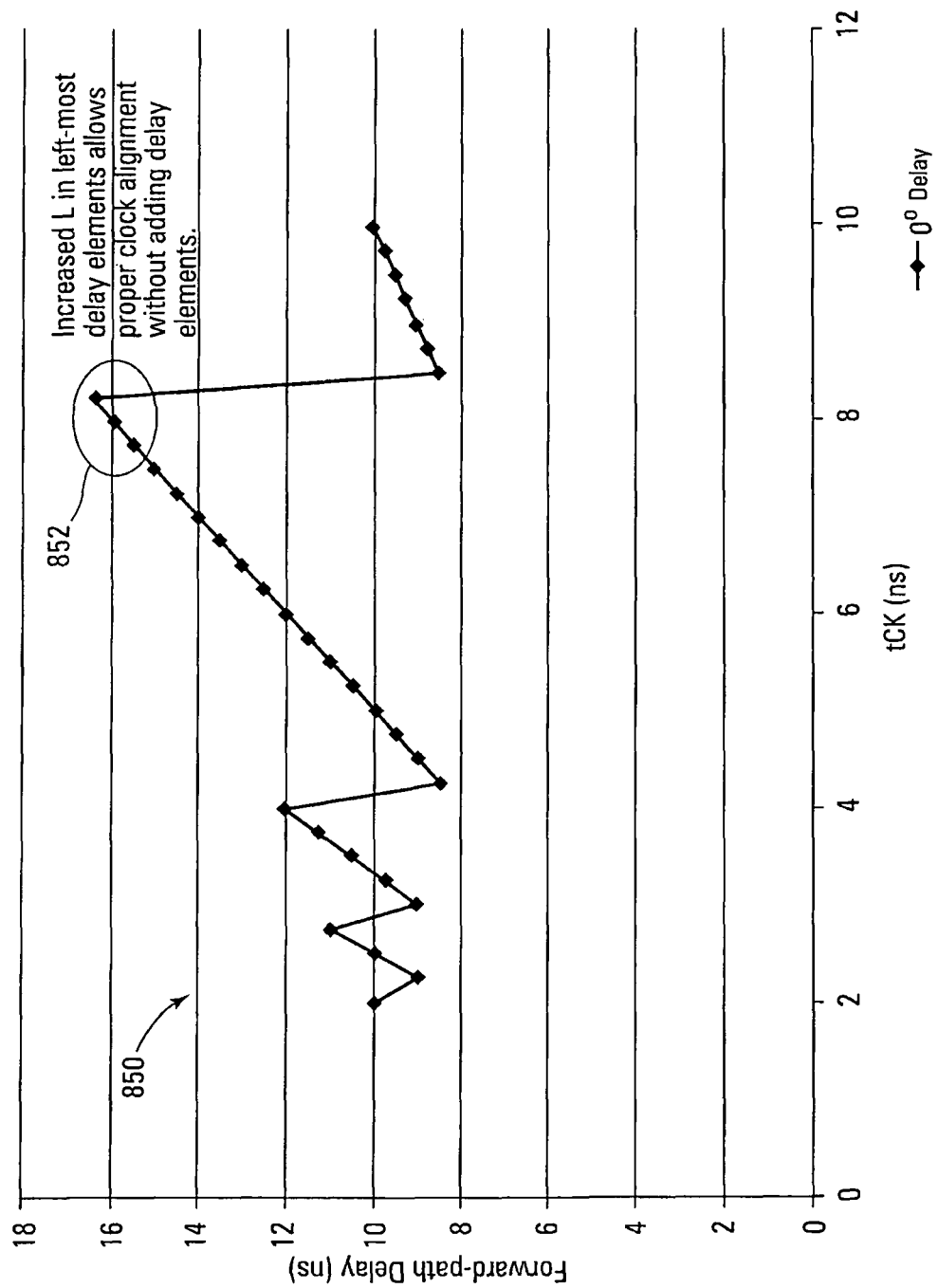

FIGS. 8A and 8B show lock curves 800, 850 of feedback based clock synchronization and skew adjustment circuit of an embodiment of the present invention, where the circuit incorporates a graduated or stepped delay line and thus does have enough delay elements to lock at slower frequencies. In FIG. 8A, the start of stepping or graduating of the delay line is shown by horizontal line 808 and the limit of the number of total delay line delay is shown by horizontal line 802 defining a region of coarser unit delay elements 810 in the delay line. The upper limits of both the 2*tCK lock curve sawtooth 804 and 1*tCK lock curve sawtooth 806 are shown extending into this region of increased (stepped or graduated) unit time delay elements 810. Because of this, the feedback based clock synchronization and skew adjustment circuit will not fail and will appropriately lock at the frequencies or voltages where the lock curve extends into the stepped or graduated region of delay elements 810 even though the same or fewer number of delay elements are being utilized by the delay line over a conventional linear delay line profile. It is noted that the region where the delay per delay element stage is increased, tCK has a longer period (slower frequency) and the timing is therefore less critical. Thus the decreased resolution does not have a negative impact on the clock synchronization and skew adjustment circuit lock ability or the performance of the system it is implemented in. The same or decreased number of delay elements also improves clock synchronization and skew adjustment circuit performance by reducing the number of active signals it contains, reducing error amplification and minimizing circuit layout size. It is also noted that the higher frequency 3*tCK sawtooth peak 812 is situated below the start of stepping/graduation 808 and thus the clock synchronization and skew adjustment circuit will not be affected by the stepped or graduated delay line at these higher frequencies and will not lose lock resolution. An example of such a graduation is shown in FIG. 8B, where the lock curve 850 of a feedback based clock synchronization and skew adjustment circuit implemented with a graduated delay line of graduated unit time delay elements is shown.

Figure 9:
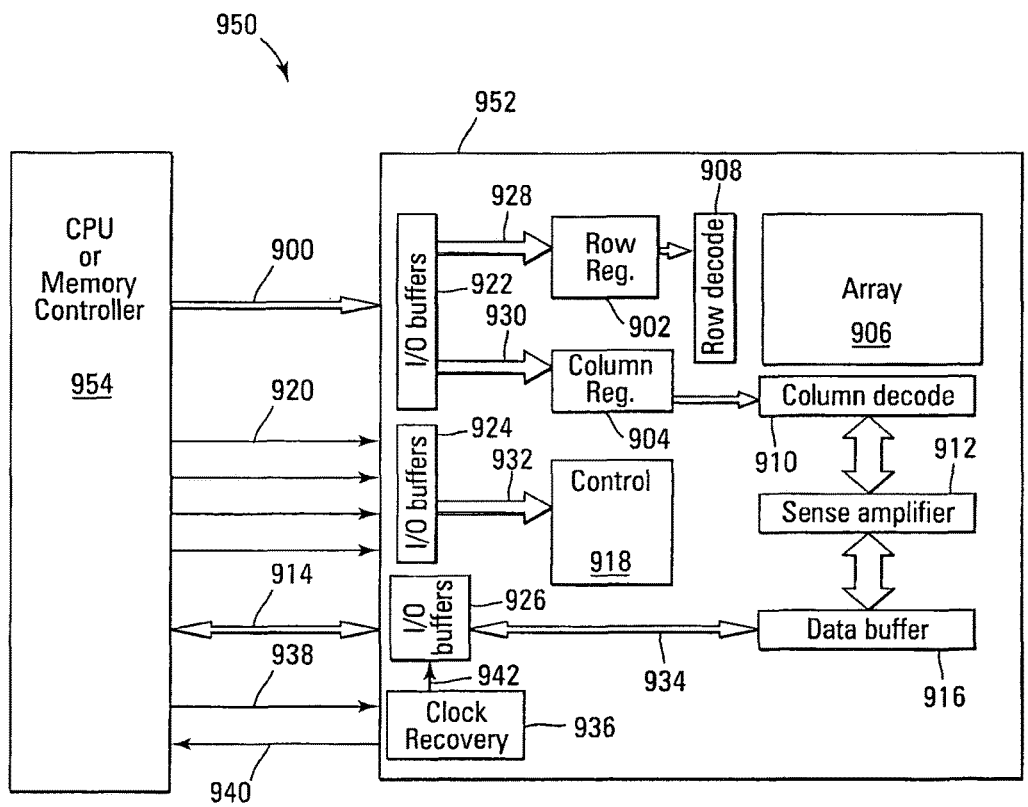
FIG. 9 details a system with a memory device in accordance with embodiments of the present invention.

FIG. 9 details a system 950 of an embodiment of the present invention with a host 954 (such as a memory controller or processor) coupled to a volatile memory device 952, such as a DRAM memory device, of an embodiment of the present invention. It is noted that the memory device of FIG. 9 is only shown as an example, and embodiments of the present invention can include multiple types of other integrated circuits (i.e., a processor, a non-volatile memory device, an ASIC, etc.). It is also noted that in other embodiments of the present invention, the system 950 and/or memory device 952 may include memory of another type, memory bus, and/or memory interface, including, but not limited to, SDRAM, DDR SDRAM, quad data rate (QDR), synchronous graphic DRAM (SGDRAM), DDR II SDRAM, Rambus memory, video RAM (VRAM), static RAM (SRAM), read only memory (ROM), electrically erasable programmable ROM (EEPROM), Flash memory, or other volatile or non-volatile memory with either a synchronous or asynchronous interfaces. Memory devices are well known in the prior art and the following description is intended only to be an overview of their operation and provide an example of their operation with an embodiment of the present invention.

The memory device 952 of FIG. 9 contains an array of memory cells (typically volatile capacitor-based memory cells in a volatile DRAM memory or non-volatile floating gate memory cells in a non-volatile Flash or EEPROM memory) arranged in columns coupled to bit lines as its main memory structure. In the memory device 952 of FIG. 9, address values for the memory are received on the external address bus connections 900. The received address values are stored internal to the memory device 952 and utilized to select the memory cells in the array to read and write data to. In the case of the memory device 952 of FIG. 9, the internal address register is shown split with both a row address register 902 and column address register 904. The address values held in the row address register 902 and column address register 904, select a data word from the memory cell array 906 through the coupled row decode 908 and column decode 910 circuits. The selected data word is read by the coupled sense amplifier circuit 912. Data values for the memory device of FIG. 9 are received and transmitted on the bi-directional data word interface 914. Internal to the memory device 952, data to be written to or from the memory array 906 is held in the Data buffer 916. Control of the memory device 952 of FIG. 9 for both read operations and write operations is actuated by the internal control circuit 918. The control circuit 918 operates in response external control signals received on control signal external interface connections 920 and to internal events. As shown in FIG. 9, all external signal connections to the memory device 952 from the host 954 are coupled to internal I/O buffers on the integrated circuit chip (922, 924, and 926). I/O buffers are shown for each of the major interfaces, address I/O buffers 922, data I/O buffers 926, and control signal I/O buffers 924. Interconnect lines (928, 930, 932, and 934) couple the I/O buffers (922, 924, and 926) to their corresponding active component input circuits that accept the incoming signals. The memory device 952 of FIG. 9 is shown integrating a clock recovery and skew adjustment circuit 936 that incorporates an embodiment of the present invention. An external clock signal 938 is coupled to the clock recovery and skew adjustment circuit 936, such as a SMD or DLL circuit, which recovers and skew adjusts the external clock. The clock recovery and skew adjustment circuit 936 also asserts a DQS strobe signal 940 and an internal clock signal 942, when the memory circuit 952 of FIG. 9 is accessed.

CONCLUSION

Clock synchronization and skew adjustment circuits have been described utilizing varying unit delay elements in the delay lines in either a graduated or a stepped unit time delay arrangement, allowing a reduced circuit implementation and improved lock characteristics. The stepped or graduated delay lines allow for reduced circuit size while maintaining a high resolution by placing a fine delay element granularity at the most critical timings for accurate signal lock. Integrated circuits and memory devices, in accordance with embodiments of the present invention utilize clock synchronization and skew adjustment circuits with either a graduated or a stepped time delay arrangement in their delay lines. These graduated or a stepped unit time delays allow reduction of the number of fine unit delay elements of the delay lines to only those necessary to sense and adjust for the high frequency signals or that portion of the clock signal time period that is critical for operation. The described invention allows clock synchronization and skew adjustment circuits to be implemented in an optimized manner that exhibits a reduced overall circuit size and power consumption, while improving lock characteristics over a wide range of frequencies.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A digital clock circuit, comprising:
   a delay line coupled to receive an input signal, wherein the delay line comprises a plurality of delay elements to sequentially pass the input signal from delay element to delay element to generate an output signal of the delay line, and wherein at least two delay elements of the plurality of delay elements differ in unit time delay; and
   a phase detector coupled to receive the input signal and a signal generated from the output signal of the delay line;
   wherein the phase detector is configured to compare the input signal to the generated signal and to provide an output for adjusting a length of the delay line to synchronize the input signal and the generated signal;
   wherein adjusting the length of the delay line comprises selecting a number of the plurality of delay elements for the delay line;
   wherein each adjusted length of the delay line consists of a respective contiguous portion of the plurality of delay elements to sequentially pass the input signal from delay element to delay element of that respective contiguous portion of the plurality of delay elements;
   wherein, for each adjusted length of the delay line, the respective contiguous portion of the plurality of delay elements for that adjusted length of the delay line comprises the respective contiguous portion of the plurality of delay elements for each adjusted length of the delay line that is less than that adjusted length; and
   wherein each delay element of the plurality of delay elements in a first portion of the delay line has a respective unit time delay that is less than or equal to a respective unit time delay of each delay element of the plurality of delay elements in a remaining portion of the delay line.

2. The digital clock circuit of claim 1, wherein the adjusted length of the delay line consists of a contiguous portion of the plurality of delay elements.

3. The digital clock circuit of claim 1, wherein the delay line comprises a first delay line comprising a first plurality of serially-connected delay elements, wherein the delay line further comprises a second delay line comprising a second plurality of serially-connected delay elements, wherein each of the first and second delay lines contains at least two delay elements that differ in unit time delay, wherein an output of the first delay line is connected to an input of the second delay line, and wherein the adjusted length of the delay line consists of a contiguous portion of the first plurality of serially-connected delay elements and a contiguous portion of the second plurality of serially-connected delay elements.

4. The digital clock circuit of claim 1, further comprising:
   wherein the delay line comprises a first delay line and a second delay line;
   wherein the plurality of delay elements comprises a first plurality of delay elements of the first delay line and a second plurality of delay elements of the second delay line;
   wherein adjusting the length of the delay line comprises selecting a number of the first plurality of delay elements for the first delay line and selecting a number of the second plurality of delay elements for the second delay line; and
   wherein the number of the first plurality of delay elements for the first delay line and the number of the second plurality of delay elements for the second delay line are the same number.

5. The digital clock circuit of claim 4, wherein the signal generated from the output signal of the delay line is the same as the output signal of the delay line.

6. The digital clock circuit of claim 1, wherein the signal generated from the output signal of the delay line comprises a delayed output signal of the delay line.

7. The digital clock circuit of claim 1, wherein the delay line and the phase detector are in a single loop.

8. An apparatus comprising:
   input/output buffers;
   a memory cell array in communication with the input/output buffers; and
   a digital delay locked loop in communication with the input/output buffers, the digital delay locked loop comprising:
      a single delay line coupled to receive an input signal, wherein the single delay line comprises a plurality of delay elements to sequentially pass the input signal from delay element to delay element of the plurality of delay elements, and wherein at least two delay elements of the plurality of delay elements in the single delay line differ in unit time delay; and
      a phase detector coupled to receive the input signal and a signal generated from an output signal of the single delay line;
      wherein the phase detector is configured to compare the input signal to the generated signal and to provide an output for adjusting a length of the single delay line to synchronize the input signal and the generated signal;
      wherein adjusting the length of the delay line consists of selecting a number of the plurality of delay elements for the delay line;
      wherein each selected number of the plurality of delay elements corresponds to a respective set of delay elements of the plurality of delay elements; and
      wherein, for each selected number of the plurality of delay elements, the respective set of delay elements corresponding to that selected number comprises the respective set of delay elements corresponding to each selected number that is less than that selected number.

9. The apparatus of claim 8, wherein the single delay line consists of a stepped delay line.

10. The apparatus of claim 9, wherein the stepped delay line comprises more than one step.

11. The apparatus of claim 8, wherein the single delay line consists of a graduated delay line.

12. The apparatus of claim 11, wherein the graduated delay line increases in unit time delay per each delay element.

13. The apparatus of claim 8, wherein the phase detector consists of a single phase detector.

14. The apparatus of claim 8, wherein the single delay line comprises a first plurality of serially-connected delay elements having a first unit time delay and a second plurality of serially-connected delay elements having a second unit time delay, wherein the second unit time delay is greater than the first unit time delay.

15. An apparatus comprising:
input/output buffers;
a memory cell array in communication with the input/output buffers; and
a digital delay locked loop in communication with the input/output buffers, the digital delay locked loop comprising:
a delay line coupled to receive an input signal, wherein the delay line comprises a plurality of serially-connected delay elements wherein at least two delay elements of the plurality of serially-connected delay elements differ in unit time delay; and
a phase detector coupled to receive the input signal and a signal generated from an output signal of the delay line;
wherein the at least two delay elements that differ in unit time delay are in a same loop with the phase detector;
wherein the delay line is configured to be adjusted to one of a plurality of lengths;
wherein each length of the plurality of lengths to which the delay line is configured to be adjusted comprises a respective subset of serially-connected delay elements of the plurality of serially-connected delay elements;
wherein the respective subset of serially-connected delay elements for any length of the plurality of lengths is different than the respective subset of serially-connected delay elements for each remaining length of the plurality of lengths;
wherein, for each length of the plurality of lengths, the respective subset of serially-connected delay elements for that length of the plurality of lengths comprises the respective subset of serially-connected delay elements for each length of the plurality of lengths less than the that length;
wherein a first portion of the delay line comprises a first subset of serially-connected delay elements of the plurality of serially-connected delay elements each having a respective unit time delay at or below a particular unit time delay; and
wherein a second portion of the delay line comprises a second subset of serially-connected delay elements of the plurality of serially-connected delay elements each having a respective unit time delay above the particular unit time delay.

16. The apparatus of claim 15, wherein the delay line consists of a stepped delay line.

17. The apparatus of claim 16, wherein the stepped delay line comprises a progressively stepped delay line.

18. The apparatus of claim 15, wherein input/output buffers, the memory cell array and the digital clock circuit of the apparatus are components of a memory device.

19. The apparatus of claim 18, wherein the apparatus further comprises a host coupled to the memory device.

20. The apparatus of claim 15, wherein the delay line consists of a graduated delay line.

21. The apparatus of claim 20, wherein the graduated delay line comprises a progressively graduated delay line.

22. The apparatus of claim 21, wherein the phase detector consists of a single phase detector.

23. The apparatus of claim 21, wherein the graduated delay line has a profile that only increases in unit time delay along a length of the graduated delay line.

24. The apparatus of claim 21, wherein the delay line comprises a first plurality of delay elements having a first unit time delay and a second plurality of delay elements having a second unit time delay, wherein the second unit time delay is greater than the first unit time delay.

25. The apparatus of claim 24, wherein the delay line further comprises a third plurality of delay elements having a third unit time delay, wherein the third unit time delay is greater than the second unit time delay.

26. An apparatus comprising:
input/output buffers;
a memory cell array in communication with the input/output buffers; and
a digital clock circuit in communication with the input/output buffers, the digital clock circuit comprising:
a delay line coupled to receive an input signal, wherein the delay line comprises a plurality of delay elements wherein at least two delay elements of the plurality of delay elements differ in unit time delay; and
a phase detector coupled to receive the input signal and a signal generated from an output signal of the delay line;
wherein the at least two delay elements that differ in unit time delay are in a same loop with the phase detector;
wherein the digital clock circuit is configured as a duty cycle corrector, wherein the delay line comprises a first delay line comprising a first plurality of serially-connected delay elements, wherein the delay line further comprises a second delay line comprising a second plurality of serially-connected delay elements, wherein the first and second delay lines are each responsive to the same control signals from the phase detector, and wherein each of the first and second delay lines contains at least two delay elements that differ in unit time delay;
wherein the first delay line and the second delay line are each configured to be adjusted to one of a plurality of lengths;
wherein each length of the plurality of lengths to which the first delay line is configured to be adjusted consists of a respective subset of serially-connected delay elements of the first plurality of serially-connected delay elements;
wherein each length of the plurality of lengths to which the second delay line is configured to be adjusted consists of a respective subset of serially-connected delay elements of the second plurality of serially-connected delay elements;
wherein, for each length of the plurality of lengths to which the first delay line is configured to be adjusted, the respective subset of serially-connected delay elements of the first plurality of serially-connected delay elements for that length of the plurality of lengths of the first delay line comprises the respective subset of serially-connected delay elements of the first plurality of serially-connected delay elements for each length of the plurality of lengths of the first delay line less than that length;
wherein, for each length of the plurality of lengths to which the second delay line is configured to be adjusted, the respective subset of serially-connected delay elements of the second plurality of serially-connected delay elements for that length of the plurality of lengths of the second delay line comprises the respective subset of serially-connected delay elements of the second plurality of serially-connected delay elements for each length of the plurality of lengths of the second delay line less than that length;
wherein each delay element of the first plurality of serially-connected delay elements in a first portion of the first delay line has a respective unit time delay that is less than or equal to a respective unit time delay of each delay element of the first plurality of serially-connected delay elements in a remaining portion of the first delay line; and wherein each delay element of the second plurality of serially-connected delay elements in a first portion of the second delay line has a respective unit time delay that is less than or equal to a respective unit time delay of each delay element of the second plurality of serially-connected delay elements in a remaining portion of the second delay line.

27. The apparatus of claim 13, wherein the first delay line and the second delay line are equal in length and are adjusted an equal amount in response to the control signals from the phase detector.

28. The apparatus of claim 13, wherein the signal generated from the output signal of the delay line comprises a signal at an output of the second delay line.

29. A digital clock circuit, comprising:
- a first delay line coupled to receive an input signal, wherein the first delay line comprises a first plurality of delay elements, and wherein at least two delay elements of the first plurality of delay elements differ in unit time delay;
- a second delay line coupled to receive an output signal of the first delay line, wherein the second delay line comprises a second plurality of delay elements, and wherein at least two delay elements of the second plurality of delay elements differ in unit time delay; and
- a phase detector coupled to receive the input signal and a signal generated from an output signal of the second delay line;

wherein the first delay line and the second delay line are each configured to be adjusted to one of a plurality of lengths;

wherein each adjusted length of the first delay line consists of a respective subset of delay elements of the first plurality of delay elements;

wherein each adjusted length of the second delay line consists of a respective subset of delay elements of the second plurality of delay elements;

wherein, for each adjusted length of the first delay line, the respective subset of delay elements of the first plurality of delay elements for that adjusted length of the first delay line comprises the respective subset of delay elements of the first plurality of delay elements for each adjusted length of the first delay line that is less than that adjusted length;

wherein, for each adjusted length of the second delay line, the respective subset of delay elements of the second plurality of delay elements for that adjusted length of the second delay line comprises the respective subset of delay elements of the second plurality of delay elements for each adjusted length of the second delay line that is less than that adjusted length;

wherein a first portion of the first delay line comprises a plurality of serially-connected delay elements each having a respective unit time delay at or below a particular unit time delay, and a second portion of the first delay line comprises a plurality of serially-connected delay elements each having a respective unit time delay above the particular unit time delay; and wherein a first portion of the second delay line comprises a plurality of serially-connected delay elements each having a respective unit time delay at or below the particular unit time delay, and a second portion of the second delay line comprises a plurality of serially-connected delay elements each having a respective unit time delay above the particular unit time delay.

30. The digital clock circuit of claim 29, wherein lengths of the first delay line and the second delay line are equal.

31. The digital clock circuit of claim 29, wherein the phase detector is configured to compare the input signal to the generated signal and to provide an output for adjusting a length of the first delay line and for adjusting a length of the second delay line.

* * * * *

UNITED STATES PATENT AND TRADEMARK OFFICE
CERTIFICATE OF CORRECTION

PATENT NO. : 10,355,698 B2
APPLICATION NO. : 14/258522
DATED : July 16, 2019
INVENTOR(S) : Gomm et al.

Page 1 of 1

It is certified that error appears in the above-identified patent and that said Letters Patent is hereby corrected as shown below:

In the Claims

Column 15, Claim 15, Line 36, delete "less than the that length" and insert in place thereof --less than that length--.

Column 17, Claim 27, Line 13, delete "claim 13" and insert in place thereof --claim 26--.

Column 17, Claim 28, Line 17, delete "claim 13" and insert in place thereof --claim 26--.

Signed and Sealed this
Twenty-fourth Day of December, 2019

Andrei Iancu
*Director of the United States Patent and Trademark Office*